(12) United States Patent
Belot et al.

(10) Patent No.: US 8,242,845 B2
(45) Date of Patent: Aug. 14, 2012

(54) RADIOFREQUENCY SIGNAL POWER AMPLIFICATION METHOD AND DEVICE

(75) Inventors: Didier Belot, Rives (FR); Laurent Leyssenne, Talence (FR); Eric Kerherve, Talence Cedex (FR); Yann Deval, Bordeaux (FR)

(73) Assignee: STMicroelectronics SA, Montrouge (FR)

( * ) Notice: Subject to any disclaimer, the term of this patent is extended or adjusted under 35 U.S.C. 154(b) by 54 days.

(21) Appl. No.: 12/841,803

(22) Filed: Jul. 22, 2010

(65) Prior Publication Data

US 2011/0018637 A1   Jan. 27, 2011

(30) Foreign Application Priority Data

Jul. 24, 2009   (FR) ...................................... 09 55197

(51) Int. Cl.
*H03G 3/10*   (2006.01)

(52) U.S. Cl. ........................................ 330/285; 330/296

(58) Field of Classification Search .................. 330/285, 330/296, 129, 136
See application file for complete search history.

(56) References Cited

U.S. PATENT DOCUMENTS

| | | | |
|---|---|---|---|
| 6,600,369 B2 * | 7/2003 | Mitzlaff .......................... 330/149 |
| 6,847,259 B2 * | 1/2005 | Kenington ....................... 330/149 |
| 6,900,697 B1 | 5/2005 | Doyle et al. ..................... 330/297 |
| 7,420,415 B2 * | 9/2008 | Lee et al. ......................... 330/136 |
| 7,454,179 B1 * | 11/2008 | Lee .............................. 455/127.1 |
| 7,519,336 B2 * | 4/2009 | Vepsalainen et al. ....... 455/127.1 |
| 7,541,867 B2 * | 6/2009 | Taylor ............................ 330/136 |
| 7,696,818 B2 * | 4/2010 | Kunihiro et al. ................ 330/10 |
| 7,839,213 B2 * | 11/2010 | de Graauw et al. ............ 330/136 |
| 7,965,140 B2 * | 6/2011 | Takahashi ....................... 330/136 |
| 2007/0004343 A1 | 1/2007 | Kandola et al. ................. 455/73 |
| 2007/0013567 A1 | 1/2007 | Matsuura et al. .............. 341/143 |

* cited by examiner

*Primary Examiner* — Henry Choe (74) *Attorney, Agent, or Firm* — Allen, Dyer, Doppelt, Milbrath & Gilchrist, P.A.

(57) ABSTRACT

A radiofrequency signal power amplification circuit may include a signal input for receiving the radiofrequency signal, an amplification stage coupled to the signal input and having at least one power transistor, a biasing stage for delivering a bias voltage to the amplification stage, and a processing stage. The processing stage may include a processing input coupled to the signal input, a processing output for delivering a bias current modulated at least in amplitude to the biasing stage, and an amplitude modulator coupled between the processing input and the processing output and configured to determine an envelope signal representative of the envelope of the radiofrequency signal, for modulating the amplitude of the envelope signal based on a variable voltage setpoint and for generating the amplitude-modulated bias current based on the modulated envelope signal.

46 Claims, 8 Drawing Sheets

RADIOFREQUENCY SIGNAL POWER AMPLIFICATION METHOD AND DEVICE

TECHNICAL FIELD

The invention relates to the power amplification of a signal, more particularly, a radiofrequency signal that is produced in the transmission subsystem of a cellular mobile telephone.

BACKGROUND

Currently, power amplification methods comprise power transistors that have to be biased, using a bias voltage, so that the power transistors may amplify the radiofrequency signal to be transmitted to a base station, for example. Generally, the bias voltage of power transistors may be controlled adaptively using switched-mode power supplies, but these switched-mode power supplies are difficult to integrate, notably in cellular mobile telephones, and they have the drawbacks of causing power losses when the power transistors are operating.

Moreover, the radiofrequency signal intended for amplification may include an envelope signal which is not constant. Such is the case with the Wideband Code Division Multiple Access (W-CDMA) standard, which is used in third generation radio communication. When the radiofrequency signal includes a modulated envelope signal, the linearity and efficiency of the power transistors are reduced.

For conventional power transistors, for example, class A, the transistor bias voltage may be chosen to be very low in order to increase the efficiency of the transistor. However, by choosing a bias voltage that is too low, the distortion, in other words the spurious harmonics, in and around the amplified signal is increased.

SUMMARY OF THE DISCLOSURE

According to one implementation and embodiment, an object may be to improve the efficiency and the linearity of a radiofrequency signal power amplifier and, in particular, to produce such a power amplification with a method that may be simple, inexpensive, small, and which may consume little current, in order to be embedded in a cellular mobile telephone.

According to one aspect, a radiofrequency signal power amplification method may comprise an amplification of the radiofrequency signal with at least one power transistor. This method may comprise a determination of an envelope signal representative of the envelope of the radiofrequency signal, a generation of a bias current modulated at least in amplitude based on the envelope signal and on a variable voltage setpoint, and a biasing of the at least one power transistor based on the modulated bias current. Thus, the efficiency and the linearity of the power transistors may be improved, regardless of the modulation of the radiofrequency signal.

In particular, it is possible to increase the efficiency when the radiofrequency signal has a low power without significantly degrading linearity. Furthermore, this method is not linked to a particular power transistor technology and may be applied to any type of transistors, such as metal oxide semiconductor (MOS), metal semiconductor field effect transistor (MESFET), and other types.

Advantageously, the determination of the envelope signal may comprise a self-mixing of the radiofrequency signal, and the generation of the bias current modulated at least in amplitude may comprise an amplitude modulation of the envelope signal by using the variable voltage setpoint. According to one implementation, the method may comprise a generation of the variable voltage setpoint based on a map established according to the average power of the radiofrequency signal. Advantageously, this map may be established according to the standard governing radiofrequency communication.

According to another implementation, the method may comprise a calculation of an envelope voltage of the signal amplified by the at least one power transistor, and the variable voltage setpoint may be generated based on an open loop mode voltage setpoint and the calculated envelope voltage. The generation of the amplitude-modulated bias current may comprise a generation of a variable gain based on the variable voltage setpoint, the amplitude-modulated bias current being generated on the basis of the variable gain and the envelope signal. Advantageously, this variable gain may be positive or negative so that the efficiency and the linearity of the power transistor may be improved regardless of the power of the radiofrequency signal, low or high.

The efficiency and the linearity of the power transistors may be improved all the more with a negative gain when the power of the radiofrequency signal is low. Conversely, the efficiency and the linearity of the power transistors may be improved all the more with a positive gain when the power of the radiofrequency signal is high.

The method may also comprise a generation of an amplitude and phase-modulated bias current based on a phase modulation of the amplitude-modulated bias current, and a biasing of the at least one power transistor based on the amplitude and phase-modulated bias current. Using a bias current that is modulated both in amplitude and in phase, the biasing of the power transistors may be controlled, regardless of the phase and amplitude modulation of the radiofrequency signal.

The phase modulation may comprise a phase advance or a phase delay of the amplitude-modulated bias current relative to the phase of the envelope of the radiofrequency signal. The method may also comprise an addition of the modulated bias current and a variable current setpoint. The method may also comprise a generation of the variable current setpoint based on a map established according to the characteristics of the power transistor or transistors.

According to another aspect, a radiofrequency signal power amplification circuit may comprise a signal input for receiving the radiofrequency signal, an amplification stage coupled to the signal input and having at least one power transistor, and a biasing stage for delivering a bias voltage to the amplification stage.

According to this other aspect, this circuit also may comprise a processing stage comprising a processing input coupled to the signal input, a processing output for delivering a bias current modulated at least in amplitude to the biasing stage, and amplitude modulation means or an amplitude modulator coupled between the processing input and the processing output and configured to determine an envelope signal representative of the envelope of the radiofrequency signal, to modulate the amplitude of the envelope signal based on a variable voltage setpoint, and to generate the amplitude-modulated bias current based on the modulated envelope signal. Advantageously, the amplitude modulator may comprise a self-mixing stage for the radiofrequency signal.

The amplitude modulator may also comprise a bias interface stage configured to generate a variable gain based on the variable voltage setpoint, and to modulate the amplitude of the envelope signal based on the generated variable gain. According to one embodiment, the processing stage may comprise a variable voltage setpoint controller based on a map established according to the average power of the radiofrequency signal.

According to another embodiment, the processing stage comprises subtraction means or a subtracter and calculation means or a calculator coupled between the output of the amplification stage and the subtracter and configured to calculate the envelope voltage of the signal amplified by the power transistor or transistors, the subtracter being configured to generate the variable voltage setpoint based on the difference between an open loop mode voltage setpoint and the calculated envelope voltage. The processing stage may also comprise phase modulator coupled between the output of the amplitude modulator and the processing output and configured to generate an amplitude and phase modulated bias current based on the amplitude-modulated bias current.

The phase modulator may comprise a filter, of integrator and differentiator type, that has cut-off frequencies that may be varied via two variable current gains, in order to phase-shift the amplitude-modulated bias current relative to the phase of the envelope of the radiofrequency signal. Thus, it is possible to use a filter of integrator type so as to generate a modulated bias current that is in phase delay, or use a filter of differentiator type to generate a modulated bias current that is in phase advance, the phase differences being produced relative to the phase of the envelope of the radiofrequency signal.

The processing stage may also comprise current summation means or a current summer coupled between the output of the phase modulator and the output of the processing means or the processor and configured to add together the modulated bias current and a variable current setpoint. The processing stage may also comprise a variable current setpoint generator operating based on a map established according to the characteristics of the power transistor or transistors.

The at least one power transistor may each comprise a control electrode for receiving the bias voltage. Moreover, the biasing stage may comprise three transistors which form, with the power transistor, a current mirror structure having a baseband amplification factor. This current mirror structure may comprise a control electrode for receiving the modulated bias current. Furthermore, the circuit may have a differential architecture. According to another aspect, there is also proposed a wireless communication appliance that may comprise a radiofrequency signal power amplification circuit as described hereinabove.

BRIEF DESCRIPTION OF THE DRAWINGS

Other advantages and characteristics may become apparent from studying the detailed description of implementations and embodiments of the invention that are by no way limiting, and the appended drawings in which.

DETAILED DESCRIPTION OF THE PREFERRED EMBODIMENTS

Figure 1:
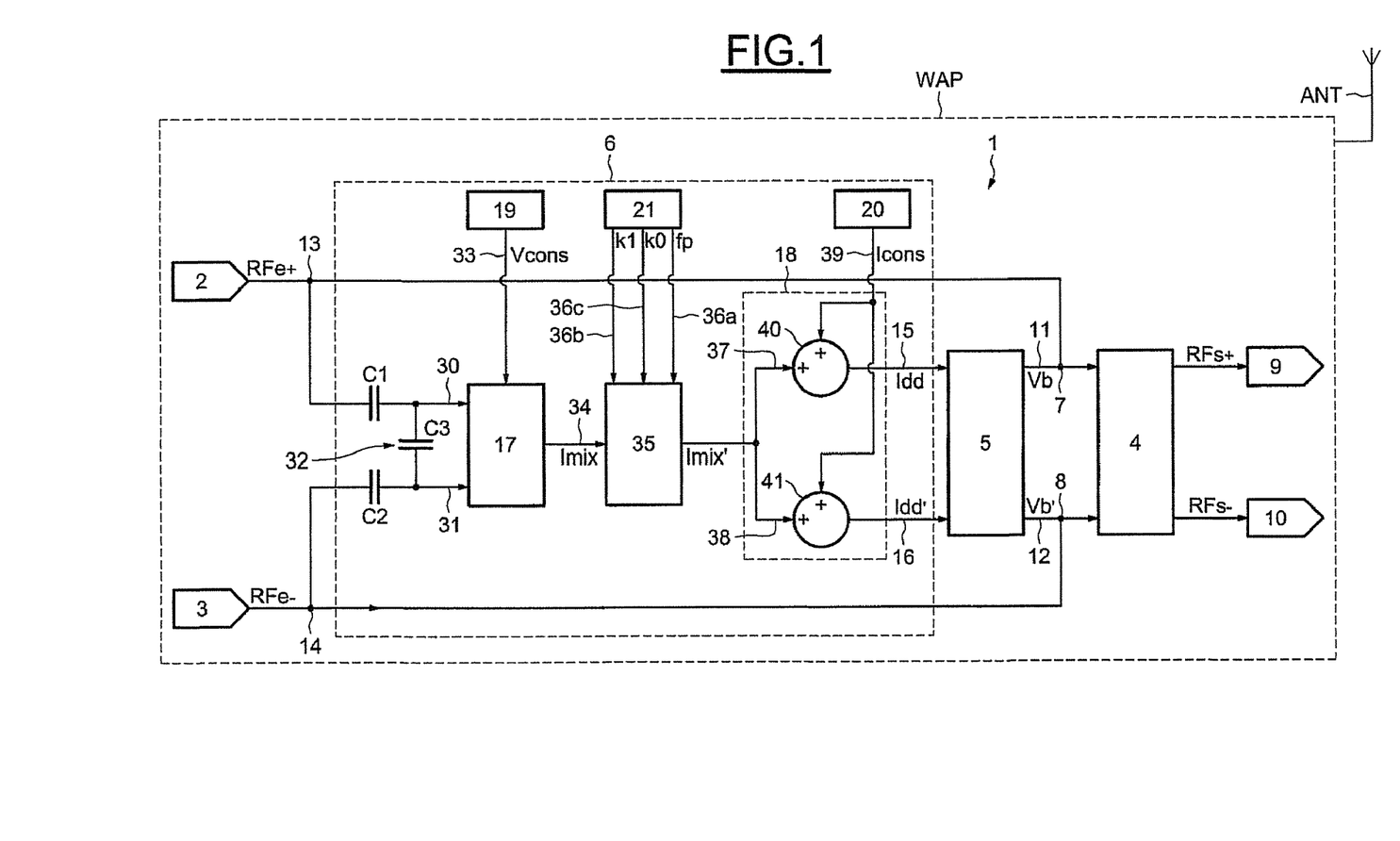
FIG. 1 is a schematic diagram of an embodiment of a radiofrequency signal power amplification circuit, according to the present disclosure.

FIG. 1 shows an embodiment of a radiofrequency signal power amplification circuit 1 with differential architecture, although the invention may be applied to an amplification circuit with single-input ("single-ended") architecture. The power amplification circuit 1 comprises a first signal input 2 and a second signal input 3 for respectively receiving the differential radiofrequency signal RFe+, RFe−. This circuit is, in this non-limiting example, incorporated in the radiofrequency transmission subsystem of a WAP wireless communication appliance, such as a cellular mobile telephone.

The power amplification circuit 1 also comprises an amplification stage 4, a biasing stage 5 and a processing stage 6. The amplification stage 4 comprises two inputs 7, 8 respectively coupled to the signal inputs 2, 3, and two outputs 9, 10. This amplification stage 4 comprises one or more power transistors configured to amplify the differential radiofrequency signal RFe+, RFe−, and to deliver on its two outputs 9, 10, respectively a differential amplified signal RFs+, RFs−. The two outputs 9 and 10 are here coupled to an antenna ANT of the WAP appliance.

The biasing stage 5 comprises two outputs 11, 12 respectively coupled to the two inputs 7, 8 of the amplification stage 4. The biasing stage 5 is able to deliver two identical and common mode bias voltages (Vb, Vb'), in order to bias the power transistor or transistors of the amplification stage 4. These two bias voltages (Vb, Vb') are applied respectively to the two inputs 7, 8 of the amplification stage 4. Furthermore, this biasing stage 5 is able to receive two identical and common mode modulated bias currents Idd, Idd', delivered by the processing stage 6.

The processing stage 6 comprises two processing inputs 13, 14 respectively coupled to the first and second signal inputs 2, 3 and two processing outputs 15, 16 which are coupled to the biasing stage 5. The processing stage 6 also comprises amplitude modulator 17, a phase modulator 35, a current summer 18, means 19 for generating a variable voltage setpoint Vcons or a variable voltage setpoint generator, means 20 for generating a variable current setpoint Icons or a variable current setpoint generator, and means 21 for generating a variable cut-off frequency setpoint fp or a variable cut-off frequency setpoint generator, and two variable current gain setpoints k0 and k1.

The processing stage 6 is configured to receive the differential radiofrequency signal RFe+, RFe− in order to generate an amplitude-modulated bias current Imix, preferably also phase-modulated Imix', this modulated bias current Imix, Imix' being intended for the biasing stage 5. The amplitude modulator 17 comprises two inputs 30 and 31 respectively coupled to the first processing input 13 and to the second processing input 14. Preferably, the processing stage may comprise a capacitive divider 32 coupled between the processing inputs 13, 14 and the inputs 30, 31 of the amplitude modulator 17.

The capacitive divider 32 comprises a first capacitor C1 mounted in series between the first processing input 13 and the first input 30 of the amplitude modulator 17, a second capacitor C2 mounted in series between the second processing input 14 and the second input 31 of the amplitude modulator 17, and a third capacitor C3 mounted in parallel with the two inputs 30, 31 of the amplitude modulator 17. This capacitive divider 32 makes it possible to attenuate the differential radiofrequency signal RFe+, RFe−, and it thus avoids having too much power taken from the input differential radiofrequency signal RFe+, RFe−. The capacitive divider 32 also makes it possible to keep the amplitude modulator 17 in a linear mode regardless of the power level of the input differential radiofrequency signal RFe+, RFe−.

The amplitude modulator 17 is configured to determine the envelope signal of the differential radiofrequency signal RFe+, RFe−. It may be noted that the envelope signal of a radiofrequency signal corresponds to a baseband signal representing the overall variations, but not the instantaneous variations, of the amplitude of the original radiofrequency signal. The envelope signal therefore represents the outline of the maxima of the original radiofrequency signal and does not include the instantaneous variations that correspond to the phase information of the original signal.

The amplitude modulator 17 also receives the variable voltage setpoint Vcons transmitted via a connection 33. Moreover, the amplitude modulator 17 is configured to generate a variable gain β based on the variable voltage setpoint Vcons, and is also configured to modulate the amplitude of the envelope signal based on the generated variable gain β. Finally, the amplitude modulator 17 is also configured to generate the amplitude-modulated bias current Imix based on the modulated envelope signal, and to deliver this current Imix on an output 34 of the amplitude modulator 17.

The processing stage 6 may also comprise a filter 35 of integrator and differentiator type, called baseband filter, coupled between the output 34 of the amplitude modulator 17 and the current summer 18. Generally, the baseband filter 35 makes it possible to smooth the amplitude-modulated bias current Imix in order to eliminate the carrier frequency from the wanted information of the signal Imix and to retain only the envelope of the signal. More particularly, the baseband filter 35 makes it possible to phase-modulate the amplitude-modulated bias current Imix. The resultant current Imix' comprises a phase advance or delay relative to the phase of the envelope of the differential radiofrequency signal RFe+, RFe−.

This phase delay or advance proves advantageous for increasing the linearity of the amplified radiofrequency signal and for compensating the phase distortion introduced by the amplification stage 4. The cut-off frequencies (zero and pole) of the baseband filter 35 are variable and may be modified based on the cut-off frequency setpoint fp and the current gain setpoints k0 and k1, which are generated by the variable cut-off frequency setpoint generator 21 and transmitted to the phase modulator 35 respectively from the connections 36a, 36b and 36c.

The current summer 18 is able to receive the amplitude-modulated bias current Imix, or the amplitude and phase modulated bias current Imix', via connections 37, 38, and to aggregate, based on an addition 40, 41, the modulated bias current Imix, or Imix', with the variable current setpoint Icons transmitted from the variable current setpoint generator 20 via a connection 39. The current summer 18 thus makes it possible to transmit two identical and common mode bias currents, amplitude and phase modulated Idd, Idd', respectively to the processing outputs 15, 16.

Figure 2:
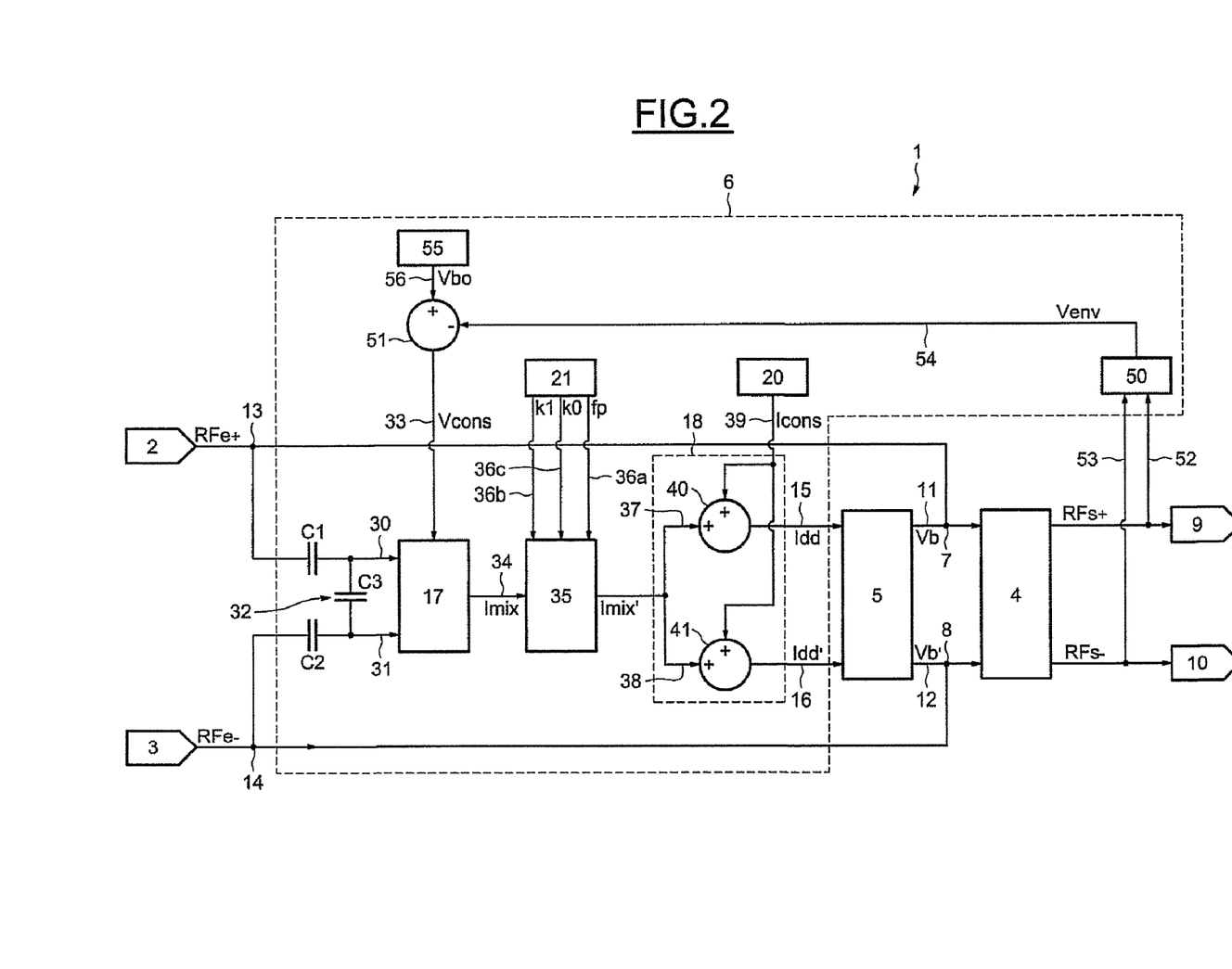
FIG. 2 is a schematic diagram of another embodiment of a radiofrequency signal power amplification circuit, according to the present disclosure.

FIG. 2 shows another embodiment of the radiofrequency signal power amplification circuit 1 with differential architecture. Some of the references of FIG. 1 have also been carried over to this figure. In this embodiment, the power amplification circuit 1 comprises a closed loop mode architecture in order to generate two modulated, identical and common mode bias currents Idd, Idd', respectively according to the differential amplified signal RFs+, RFs−.

In this power amplification circuit 1, the processing stage 6 comprises: an envelope calculator 50, and a subtractor 51. The envelope calculator 50 is able to receive the differential amplified signals RFs+, RFs− respectively transmitted via connections 52, 53 from the amplification stage 4. This envelope calculator 50 is used to calculate the envelope voltage of the amplified signal Venv, based on a signal processing, such as, for example, a filtering, in order to transmit it to the subtracter 51 via a connection 54.

The subtracter 51 is used to generate the variable voltage setpoint Vcons based on the difference between an open loop mode voltage setpoint Vbo, generated by a module 55, and the envelope voltage of the amplified signal Venv. The open loop mode voltage setpoint Vbo is transmitted from the module 55 via a connection 56.

Figure 3:
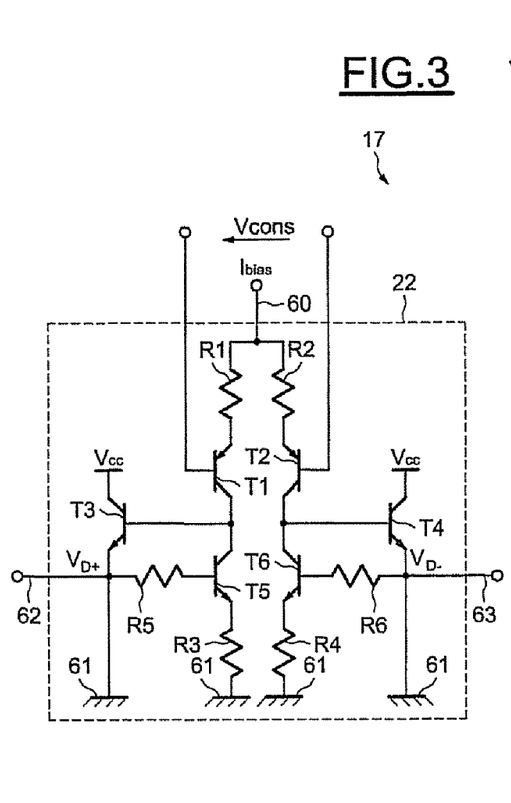
FIG. 3 is a schematic diagram of an embodiment of the radiofrequency signal amplitude modulator, according to the present disclosure.

FIG. 3 shows an embodiment of the radiofrequency signal amplitude modulator 17. Some of the references from the preceding FIGS. 1 and 2 have also been carried over to this figure. The amplitude modulator 17 comprises a voltage transformation stage 22 and a stage 23 for generating the amplitude-modulated bias current Imix. The voltage transformation stage 22 is used to transform the variable voltage setpoint Vcons received from the variable voltage setpoint generator 19 into a differential bias voltage VD+, VD−. Furthermore, this voltage transformation stage 22 receives a bias current Ibias via an input 60. This first voltage transformation stage 22 comprises six transistors T1 to T6 and six resistors R1 to R6.

The first resistor R1 is coupled between the input 60 and the source of the first transistor T1, and the second resistor R2 is coupled between the input 60 and the source of the second transistor T2. The first and second transistors T1, T2 receive the variable voltage setpoint Vcons on their gate. The drain of the first transistor T1 is coupled to the gate of the third transistor T3, and the drain of the second transistor T2 is coupled to the gate of the fourth transistor T4. The third transistor T3 has its drain coupled to a power supply voltage Vcc and has its source coupled to a ground 61. The fourth transistor T4 has its drain coupled to the power supply voltage Vcc and has its source coupled to the ground 61.

Moreover, the fifth transistor T5 has its drain coupled to the drain of the first transistor T1 and has its source coupled to the third resistor R3. The sixth transistor T6 has its drain coupled to the drain of the second transistor T2 and has its source coupled to the fourth resistor R4. The third and fourth resistors R3 and R4 are also coupled to the ground 61. The fifth resistor R5 is coupled between the gate of the fifth transistor T5 and the source of the third transistor T3. The sixth resistor R6 is coupled between the gate of the sixth transistor T6 and the source of the fourth transistor T4.

The voltage transformation stage 22 is configured to generate the first bias voltage VD+ on an output 62 coupled to the source of the third transistor T3, and the second bias voltage VD− on a second output 63 coupled to the source of the fourth transistor T4. This differential bias voltage VD+, VD− is intended for the stage 23 for generating the amplitude-modulated bias current Imix.

The generation stage 23 comprises a self-mixing stage 23a, a bias interface stage 23b and transmitter 23c. The self-mixing stage 23a comprises two differential pairs of transistors P1, P2, four resistors RD1 to RD4, two inputs E1, E2 and two outputs S1, S2. The first differential pair of transistors P1 comprises a first transistor QA1, which has its source coupled to a first terminal of the resistor RD1, its drain coupled to the first output S1, and its gate coupled to the second input 31 of the amplitude modulator 17. The second transistor QA2 of the first pair P1 has its source coupled to a first terminal of the second resistor RD2, its drain coupled to the second output S2 and its gate is coupled to the first input 30 of the amplitude modulator 17. The resistors RD1 and RD2 have their second terminal coupled to the first input E1.

The second differential pair of transistors P2 comprises a first transistor QA3 which has its source coupled to a first terminal of the third resistor RD3, its drain coupled to the first output S1, and its gate coupled to the gate of the second transistor QA2 of the first differential pair P1. The second transistor QA4 of the second pair P2 has its drain coupled to the second output S2, its source coupled to a first terminal of the fourth resistor RD4 and its gate coupled to the gate of the first transistor QA1 of the first pair P1. The third and fourth resistors RD3, RD4 have their second terminal coupled to the second input E2.

The bias interface stage 23b is used to produce a variable transconductance gain; it comprises two differential pairs of transistors P3, P4, four resistors RB1 to RB4, and four inputs EB1 to EB4. The first differential pair P3 comprises a first transistor QL+ which has its drain coupled to the second input E2 of the self-mixing stage 23a, its source coupled to a first terminal of the first resistor RB1, and its gate is coupled to the first input EB1 of the bias interface stage 23b. The second transistor QL− of the first pair P3 has its drain coupled to the first input E1 of the self-mixing stage 23a, its source coupled to a first terminal of the second resistor RB2, and its gate coupled to the second input EB2 of the bias interface stage 23b. The first and second resistors RB1, RB2 have their second terminal coupled to the ground 61.

The second differential pair P4 of the bias interface stage 23b comprises two transistors QH+, QH−. The third resistor RB3 is coupled between the ground 61 and the source of the transistor QH+, the fourth resistor RB4 is coupled between the ground 61 and the source of the transistor QH−, and the transistors QH+, QH− have their drains respectively coupled to the first and second inputs E1, E2 of the self-mixing stage 23a. The gate of the transistor QH+ is coupled to the third input EB3 of the bias interface stage 23b, the transistor QH− has its gate coupled to the fourth input EB4 of the bias interface stage 23b.

The bias interface stage 23b also comprises four additional resistors RB5 to RB8 and four capacitors CB1 to CB4. The fifth resistor RB5 is coupled between the third input EB3 of the bias interface stage 23b and the first output 62 of the voltage transformation stage 22. The sixth resistor RB6 is coupled between the fourth input EB4 of the bias interface stage 23b and the first output 62 of the voltage transformation stage 22. The seventh resistor RB7 is coupled between the second input EB2 of the bias interface stage 23b and the second output 63 of the voltage transformation stage 22. The eighth resistor RB8 is coupled between the first input EB1 of the bias interface stage 23b and the second output 63 of the voltage transformation stage 22.

The first capacitor CB1 is coupled between the third input EB3 of the bias interface stage 23b and the first input 30 of the amplitude modulator 17. The second capacitor CB2 is coupled between the fourth input EB4 of the bias interface stage 23b and the second input 31 of the amplitude modulator 17. The third capacitor CB3 is coupled between the second input EB2 of the bias interface stage 23b and the second input 31 of the amplitude modulator 17. The fourth capacitor CB4 is coupled between the first input EB1 of the bias interface stage 23b and the first input 30 of the amplitude modulator 17.

The transmission means or a transmitter 23c comprise six transistors MP1 to MP6. The first transistor MP1 has its source coupled to the power supply voltage Vcc, its drain and its gate coupled to the first output S1 of the self-mixing stage 23a. The second transistor MP2 has its source coupled to the power supply voltage Vcc, its drain and its gate coupled to the second output S2 of the self-mixing stage 23a. The third transistor MP3 has its source coupled to the power supply voltage Vcc, its drain coupled to the drain of the fourth transistor MP4 and its gate coupled to the gate and to the drain of the first transistor MP1 and to the first output S1 of the self-mixing stage 23a. The fourth transistor MP4 has its source coupled to the ground 61 and its gate coupled to its drain and to the gate of the sixth transistor MP6. The fifth transistor MP5 has its source coupled to the source of the second transistor MP2, its drain coupled to the output 34 of the amplitude modulator 17 and its gate coupled to the second output S2 of the self-mixing stage 23a. Finally, the sixth transistor MP6 has its source coupled to the ground 61 and its drain coupled to the output 34 of the amplitude modulator 17.

The self-mixing stage 23a is configured to determine the envelope signal from a self-mixing of the differential radiofrequency signal RFe+, RFe−. This self-mixing stage 23a may be a mixer with diodes, or preferentially with transistors QA1 to QA4.

Preferably, the generation stage 23 comprises a variable gain Gilbert cell mixer, represented in FIG. 3 by the association of the transistor-based mixer 23a with the first pair P3 of the bias interface stage 23b. In this configuration, the variable gain may vary while remaining strictly positive only. As a variant, the generation stage 23 comprises a Gilbert cell mixer modified by associating the Gilbert cell mixer 23a with the second pair P4 of the bias interface stage 23b. In this configuration, the variable gain may vary positively and negatively.

The bias interface stage 23b is configured to generate a variable gain β according to the following equations (1) and (2):

$$\beta = \frac{\partial^2 I_{mix}}{\partial Ve^2} \quad \text{equation (1)}$$

$$\beta = M \cdot Ibias \cdot Aatt^2 \cdot \frac{Vcons}{8 \cdot Ut^3} \quad \text{equation (2)}$$

β: the variable gain of the amplitude modulator 17;
$I_{mix}$: the amplitude-modulated bias current;
Ve: the differential voltage of the radiofrequency signal RFe+, RFe−;
Aatt: the attenuation coefficient of the capacitive divider 32;
Ut: thermal voltage of the transistors of the voltage transformation stage 22;
Ibias: the bias current of the transistors of the voltage transformation stage 22;
M: the multiplying gain of the transistors MP5 and MP6 of the transmitter 23c.

The variable voltage setpoint Vcons depends on the average power of the radiofrequency signal. This voltage Vcons is variable, it may be positive, negative or zero. Consequently, the variable gain β may be positive, negative or zero.

The bias interface stage 23b is therefore used to bias the transistors QA1 to QA4 of the self-mixing stage so as to modulate the amplitude of the envelope signal. In other words, the bias interface stage 23b is configured to modulate the amplitude of the envelope signal. In practice, when the variable voltage setpoint Vcons is positive, then the voltage VD− may be higher than the voltage VD+. In this case, the transistors QL+, QL− of the first pair P3 of transistors of the bias interface stage 23b are gradually activated and the transistors QH+, QH− of the second pair P4 of transistors of the bias interface stage 23b are debiased, which leads to the generation of a positive gain β.

On the contrary, when the variable voltage setpoint Vcons is negative, then the voltage VD+ may be higher than the voltage VD−. In this case, the transistors QH+, QH− of the second pair P4 of transistors of the bias interface stage 23b are gradually activated and the transistors QL+, QL− of the first pair P3 of transistors of the bias interface stage 23b are depolarized, which leads to the generation of a negative gain β.

Furthermore, the amplitude modulator 17 described in this way is particularly suited to a cellular mobile telephone because they consume little current. The amplitude modulator 17 is used to deliver an amplitude-modulated bias current Imix according to the following equation (3):

$$I_{mix}(f) = \beta(Vcons) \cdot |Ve|^2(f) \quad \text{equation (3)}$$

β(Vcons): the variable gain of the amplitude modulator 17 according to the variable voltage setpoint Vcons;

f: frequency of the baseband signal;

Ve: the differential voltage of the radiofrequency signal RFe+, RFe−.

Figure 4:
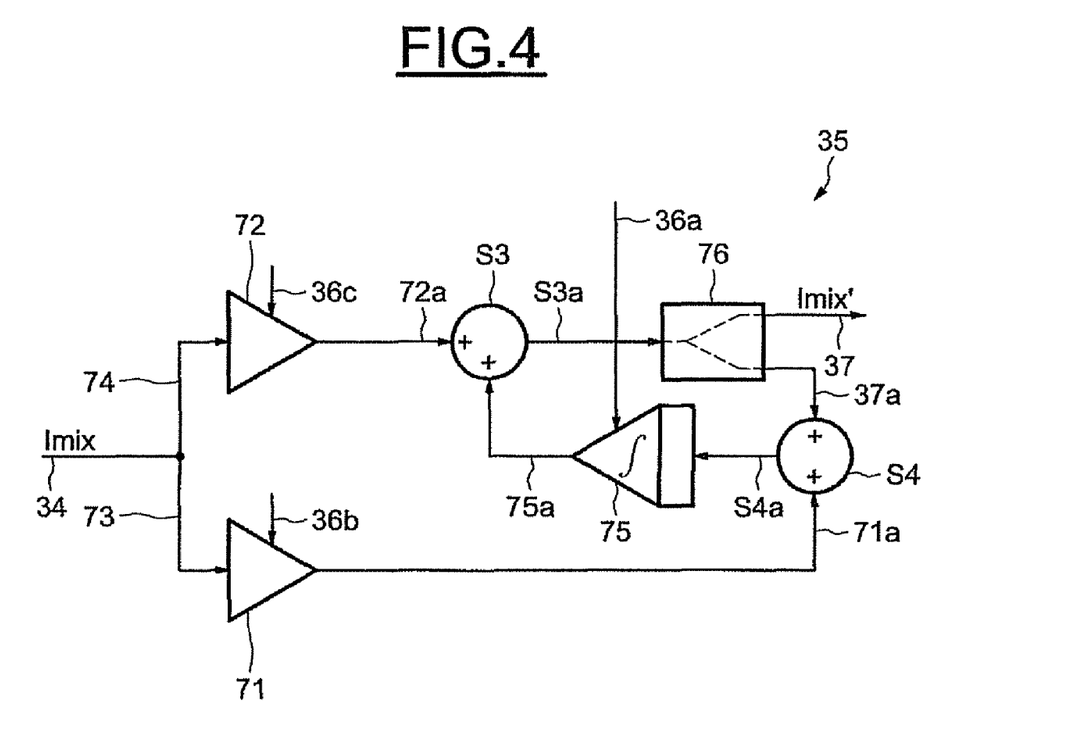
FIG. 4 is a schematic diagram of an embodiment of a filter of integrator and differentiator type, according to the present disclosure.

FIG. 4 shows an embodiment of the baseband filter 35. Some of the references from the preceding figures have also been carried over to this figure. The baseband filter comprises two variable current gain amplifiers 71, 72, produced, for example, using a current mirror with two output copies. The first amplifier 71 amplifies the amplitude-modulated bias current Imix, received via a connection 73, based on the current gain setpoint −k0 received via the connection 36b. The second amplifier 72 amplifies the amplitude-modulated bias current Imix, received via a connection 74, based on the current gain setpoint −k1 received via the connection 36c.

The baseband filter 35 also comprises an integrator-type filter 75, a second current mirror 76, and two summation means or two summers S3 and S4. The first summer S3 is configured to add together the current obtained from the second amplifier 72, via a connection 72a, and the current obtained from the integrator-type filter 75, via a connection 75a, and to transmit the result to the second current mirror 76 via a connection S3a. The second current mirror 76 has a gain that is preferably equal to −1 and it is configured to transmit the modulated bias current Imix' via the connection 37 to the current summer 18 and via a connection 37a to the second summer S4.

The second summer S4 is configured to add together the current obtained from the first amplifier 71, via a connection 71a, and an image (or a copy) of the modulated bias current Imix', via the connection 37a, and to transmit the result to the integrator-type filter 75 via a connection S4a. The summers S3, S4, 75 and 76 constitute a loop that performs both differentiation and integration functions.

The baseband filter 35 is configured to phase-shift the amplitude-modulated bias current Imix and to generate the phase- and amplitude-modulated bias current Imix' according to the following equations (4 and 5):

$$Imix'(f) = Imix(f) \cdot H(f) = Imix(f) \cdot k0 \cdot \frac{\left(1 + \frac{jf}{fz}\right)}{\left(1 + \frac{jf}{fp}\right)} \quad \text{equation (4)}$$

$$fz = fp \cdot \frac{k0}{k1} \quad \text{equation (5)}$$

H(f): the transfer function of the baseband filter 35 as a function of the frequency f;

k0, k1: variable current gain setpoints of the first and second amplifiers;

jf: component in the complex-mode representation of the frequency of the amplitude-modulated bias current Imix;

fp: variable cut-off frequency setpoint, denoted pole frequency setpoint, of the baseband filter 35; and fz: variable cut-off frequency, denoted zero frequency, of the baseband filter 35.

When k0 is strictly less than k1, the zero frequency fz of the baseband filter 35 is strictly less than the pole frequency setpoint fp of the baseband filter 35, and a modulated bias current Imix' is thus generated with a phase advance relative to the envelope of the differential radiofrequency signal RFe+, RFe− for the frequency band between fz and fp. When k0 is greater than or equal to k1, the zero frequency fz of the baseband filter 35 is greater than or equal to the pole frequency setpoint fp of the baseband filter 35, and a modulated bias current Imix' is thus generated with a phase delay relative to the envelope of the differential radiofrequency signal RFe+, RFe− for the frequency band between fp and fz.

By varying the current gain setpoint values k0, k1 it is possible either to create a phase advance, or to create a phase delay on the amplitude-modulated bias current Imix. By varying the cut-off frequency setpoint fp, the bandwidth of the filter 35 is modified and it is thus possible to improve the smoothing of the amplitude-modulated bias current Imix.

Then, after having applied the baseband filter 35 to the amplitude-modulated bias signal Imix, the filtered bias signal Imix' is obtained according to the following equation (6):

$$I_{mix}'(f) = H(f) \cdot \beta(Vcons) \cdot |Ve|^2(f) \quad \text{equation (6)}$$

Figure 5:
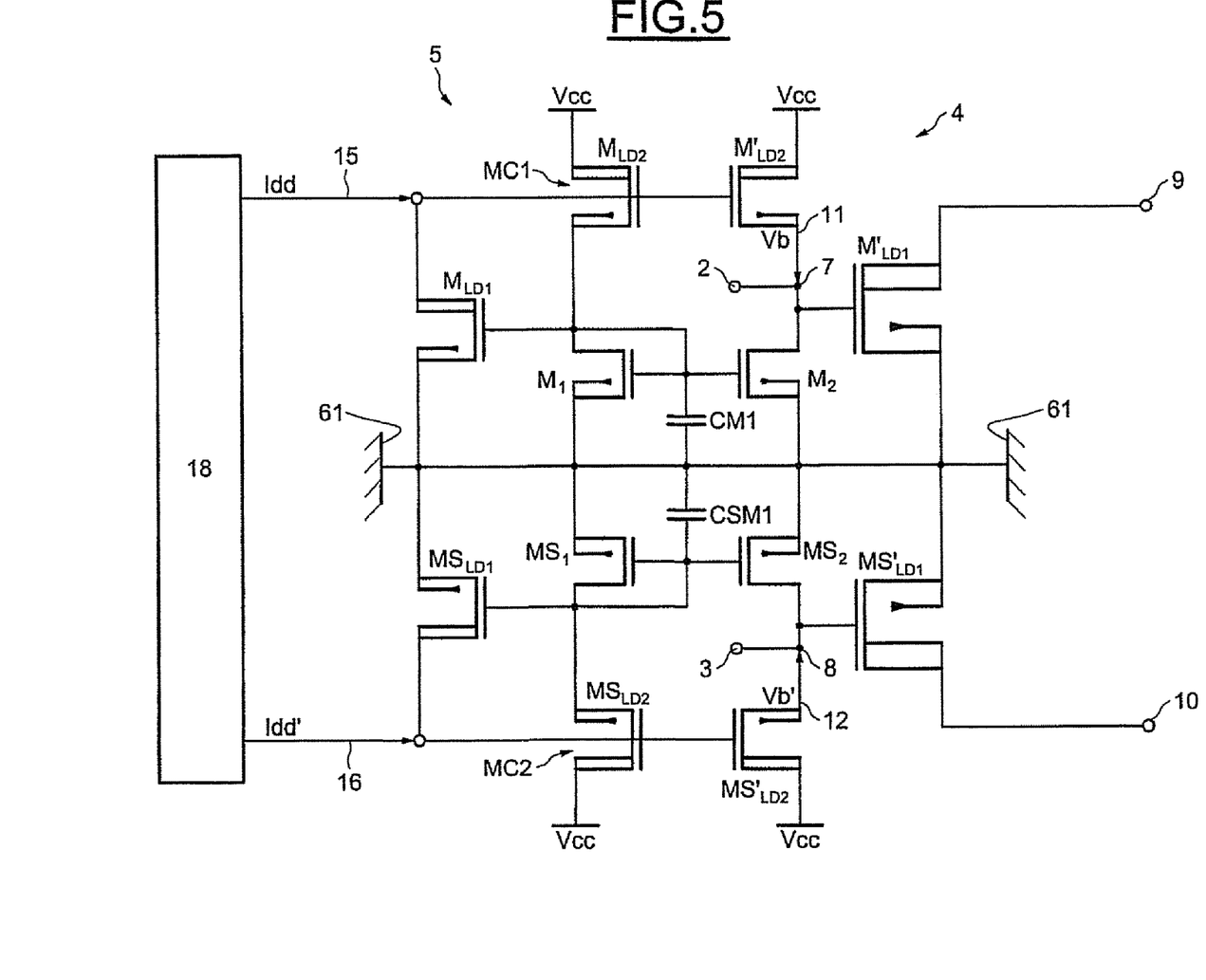
FIG. 5 is a schematic diagram of an embodiment of a biasing stage and of an amplification stage, according to the present disclosure.

FIG. 5 shows an embodiment of a biasing stage 5 and of an amplification stage 4. Some of the references from the preceding figures have also been carried over to this figure. The biasing stage 5 comprises three bias transistors MLD1, MLD2, M'LD2. The amplification stage 4 comprises a power transistor M'LD1 coupled between the first output 7 of the biasing stage 5 and the first output 9 of the amplification stage 4.

The three bias transistors MLD1, MLD2, M'LD2 of the biasing stage 5 form, with the power transistor M'LD1, a current mirror structure MC1 with a current gain $N_{power}$. This current mirror structure MC1 is thus constructed, the first bias transistor MLD1 has its drain coupled to the first processing output 15, its source coupled to the ground 61, and its gate coupled to the source of the second bias transistor MLD2. This second bias transistor MLD2 has its drain coupled to the power supply voltage Vcc and its gate coupled to the gate of the third bias transistor M'LD2.

The third bias transistor M'LD2 has its drain coupled to the power supply voltage Vcc and its source coupled to the first output 11 of the biasing stage 5. The power transistor M'LD1 has its drain coupled to the first output 9 of the amplification stage 4, its source coupled to the ground 61, and its gate coupled to the first output 11 of the biasing stage 5.

Furthermore, the biasing stage 5 may comprise two protection transistors M1, M2 and a capacitor CM1 mounted as follows: the first protection transistor M1 has its drain coupled to the source of the second bias transistor MLD2, its source coupled to the ground 61, and its gate coupled to its drain, to the capacitor CM1 and to the gate of the second protection transistor M2; the second protection transistor M2 has its drain coupled to the gate of the power transistor M'LD1, its source coupled to the ground 61; and the capacitor CM1 is also coupled to the ground 61. These protection transistors M1, M2 protect the current mirror transistors MC1, notably by preventing them from saturating.

In the case of a differential architecture, methods are used that are similar to those described hereinabove to process the differential modulated bias current Idd' and the differential radiofrequency signal RFe−. In this case, the biasing stage 5 also comprises three additional bias transistors MSLD1, MSLD2, MS'LD2. The amplification stage 4 also comprises a second power transistor MS'LD1 coupled between the second output 12 of the biasing stage 5 and the second output 10 of the amplification stage 4.

The three additional bias transistors MSLD1, MSLD2, MS'LD2 of the biasing stage 5 form, with the second power transistor MS'LD1, a second current mirror structure MC2 with a current gain $N_{power}$. This second current mirror structure MC2 is thus constructed: the first additional bias transistor MSLD1 has its drain coupled to the second processing output 16, its source coupled to the ground 61, and its gate coupled to the source of the second additional bias transistor MSLD2. The second additional bias transistor MSLD2 has its drain coupled to the power supply voltage Vcc and its gate coupled to the gate of the third additional bias transistor MS'LD2.

The third additional bias transistor MS'LD2 has its drain coupled to the power supply voltage Vcc and its source coupled to the second output 12 of the biasing stage 5. The second power transistor MS'LD1 has its drain coupled to the second output 10 of the amplification stage 4, its source coupled to the ground 61, and its gate coupled to the second output 12 of the biasing stage 5.

Furthermore, the biasing stage 5 may comprise two additional protection transistors MS1, MS2 and a second capacitor CSM1 mounted as follows: the first additional protection transistor MS1 has its drain coupled to the source of the second additional bias transistor MSLD2, its source coupled to the ground 61, and its gate coupled to its drain, to the second capacitor CSM1 and to the gate of the second additional protection transistor MS2. The second additional protection transistor MS2 has its drain coupled to the base of the second power transistor MS'LD1, its source coupled to the ground 61; and the second capacitor CSM1 is also coupled to the ground 61. These additional protection transistors MS1, MS2 protect the transistors of the second current mirror structure MC2, notably by preventing them from saturating.

The biasing stage 5 receives, from the first processing output 15, the phase and amplitude-modulated bias current Idd, according to the following equation (7):

$$Idd = \frac{I'_{mix}}{2} + \frac{Icons}{2} = \frac{I'_{mix}}{2} + \frac{Iddq}{2Npower} \quad \text{equation (7)}$$

Idd: the phase- and amplitude-modulated bias h;
Icons: the variable current setpoint such that: Icons=Iddq/$N_{power}$;
$N_{power}$: the gain factor of the current mirror MC1; and
Iddq: the sum of the idle currents of the power transistors M'LD1 and MS'LD1.

The variable current setpoint Icons depends on the characteristics of the power transistor or transistors of the amplification stage 4, notably on the aging of the transistors. This current Icons represents the operating threshold of the power transistor or transistors, i.e., the minimum current that may be supplied for the power transistor or transistors to operate.

When the radiofrequency signal RFe+ is applied, a bias current, or baseband current, supplied by the third bias transistor M'LD2, increases. The gate voltage Vb of the power transistor M'LD1 also increases, as does the current Id consumed by the power transistor M'LD1 according to the following equation (8):

$$\Delta Id(f,Ve) = \alpha(f) \cdot |Ve|^2(f) \quad \text{equation (8)}$$

α(f): second-order transconductance gain of the power transistor M'LD1 when it is charged on its gate by the source of the third bias transistor M'LD2; and ΔId(f,Ve): component of the current consumed by the power transistor M'LD1, generated by the third bias transistor M'LD2.

The current Id consumed by the power transistor M'LD1 is given by the following equations (9) and (10):

$$Id(f, Ve) = \Delta Id(Ve) + (Npower \cdot Idd) \quad \text{equation (9)}$$

$$Id(f, Ve) = \frac{Iddq}{2} + \left(\alpha(f) + \frac{Npower \cdot H(f) \cdot \beta(Vcons)}{2}\right) \cdot |Ve|^2(f)$$

equation (10)

When the radiofrequency signal is amplified with a low idle current Iddq, spurious harmonics increase in the amplified signal RFs+, in particular third-order harmonics. The use of a bias transistor M'LD2 makes it possible to initially attenuate these spurious harmonics. In practice, the third bias transistor M'LD2 generates a current component ΔId(f,Ve) which is intermodulated with the radiofrequency signal via the second-order non-linearities of the power transistor M'LD1 and partly compensates the third-order harmonics of the amplified signal RFs+.

Using, notably, the phase and amplitude-modulated bias current Idd, the attenuation of the third-order harmonics is improved. Furthermore, using a variable gain β which may be positive or negative, the attenuation is improved regardless of the value of the power of the radiofrequency signal. Moreover, thanks to the variable gain β, it is possible to remedy an under-biasing or an over-biasing of the power transistors M'LD1, M'LD2. In practice, when the average power of the radiofrequency signal RFe+ is low, the variable voltage setpoint Vcons is negative and generates a negative variable gain β. When the average power of the radiofrequency signal RFe+ is high, the variable voltage setpoint Vcons is positive and generates a positive variable gain β. Advantageously, when the average power of the radiofrequency signal is low, the modulated bias current Idd is reduced so that it is as low as possible and it approaches the variable setpoint current Icons.

Figure 6:
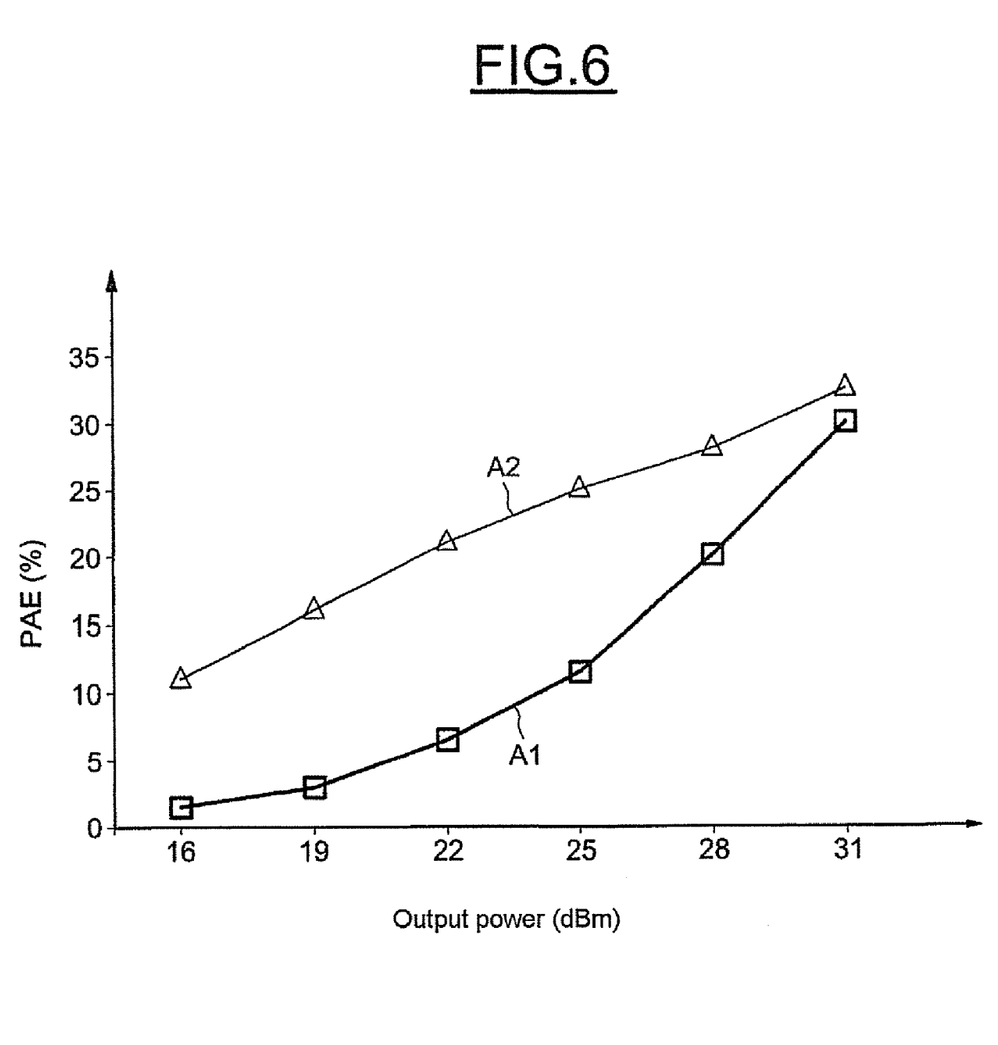
FIG. 6 is a diagram of power transistor efficiency curves, according to the present disclosure.

FIG. 6 shows efficiency curves of the power transistors. The curves A1, A2 that are shown may be used to compare the behavior of a conventional class A power transistor with a power transistor biased according to the invention. The curves A1, A2 were obtained from a signal with two tones spaced apart by 200 kHz. The x-axis gives the output power of the transistors in dBm, i.e. in decibels (dB) referenced to a milliwatt. The y-axis shows the PAE (power added efficiency) values, as a percentage.

The PAE is also expressed according to the following equation (11):

$$PAE = 100 \cdot \frac{(Ps - Pe)}{Pc} \quad \text{equation (11)}$$

PAE: the power added efficiency of the transistor;
Ps: the power of the amplified radiofrequency signal, or the power of the output signal;
Pe: the power of the radiofrequency signal at the input of the transistor; and
Pc: the power consumed by the transistor during amplification.

The first curve A1 represents the efficiency of a conventional class A transistor and the second curve A2 represents the efficiency of a power transistor integrated in an amplification circuit according to the present disclosure. It may be noted that, when the radiofrequency signal has a low power, the efficiency of the power transistor according to the second curve A2 is greater than that of the conventional class A transistor.

Figure 7:
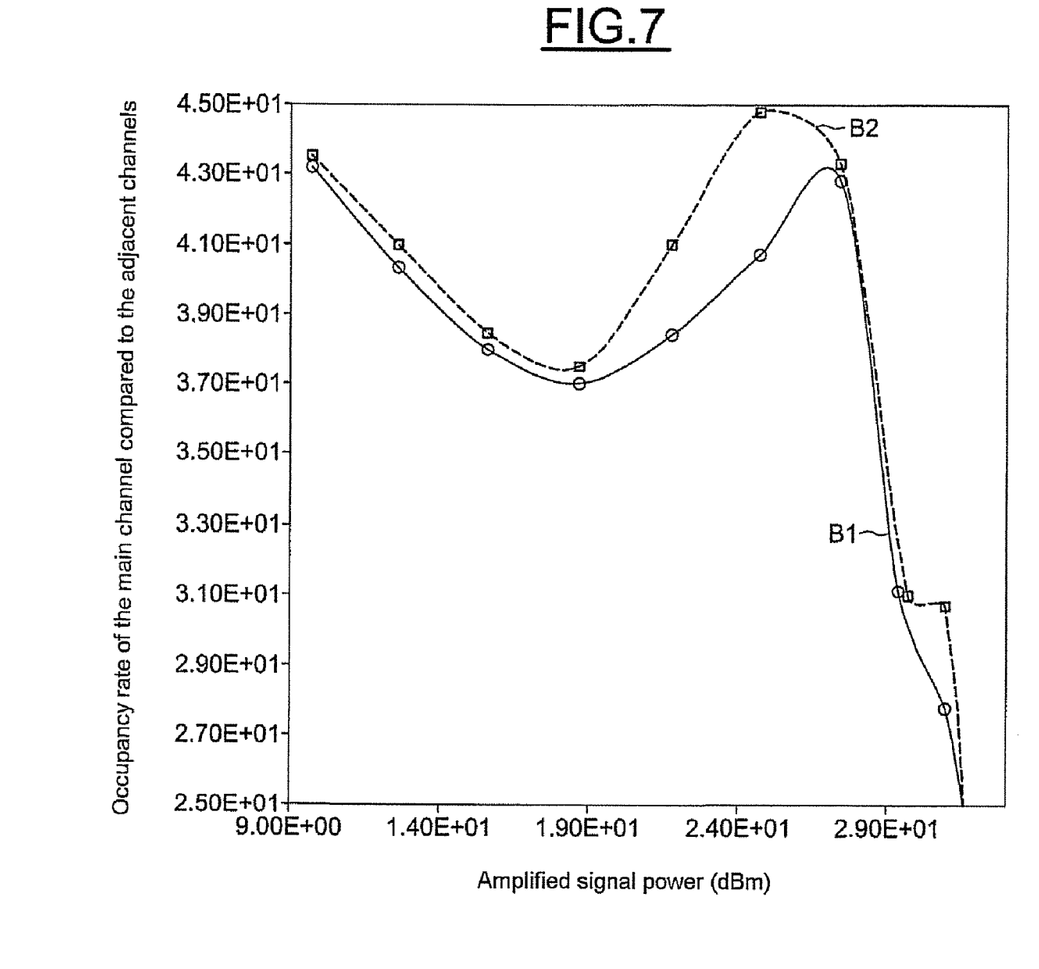
FIG. 7 is a diagram of power transistor linearity curves, according to the present disclosure.

FIG. 7 shows linearity curves of the power transistors. The linearity of the transistors is evaluated based on the measurement of the occupancy rate of the main channel by the radiofrequency signal relative to the adjacent channels according to the power of the amplified signal RFs+. The curves B1 and B2 represented may be used to compare the linearity of a conventional adaptive power transistor with a biased power transistor according to the present disclosure.

The curve B1 represents the linearity of a conventional adaptive power transistor, with the variable voltage setpoint Vcons kept at a zero value. In this case, the adaptive character is covered solely by the term α(f) described in the equation (8). The curve B2 was obtained from a variable voltage setpoint Vcons established on the basis of a map of voltages as a function of the power of the radiofrequency signal. The x-axis shows the power of the amplified signal RFs+ in dBm, that is to say in decibels (dB) referenced to a milliwatt. The y-axis shows the occupancy rate of the main channel by the radiofrequency signal relative to the adjacent channels.

Figure 8:
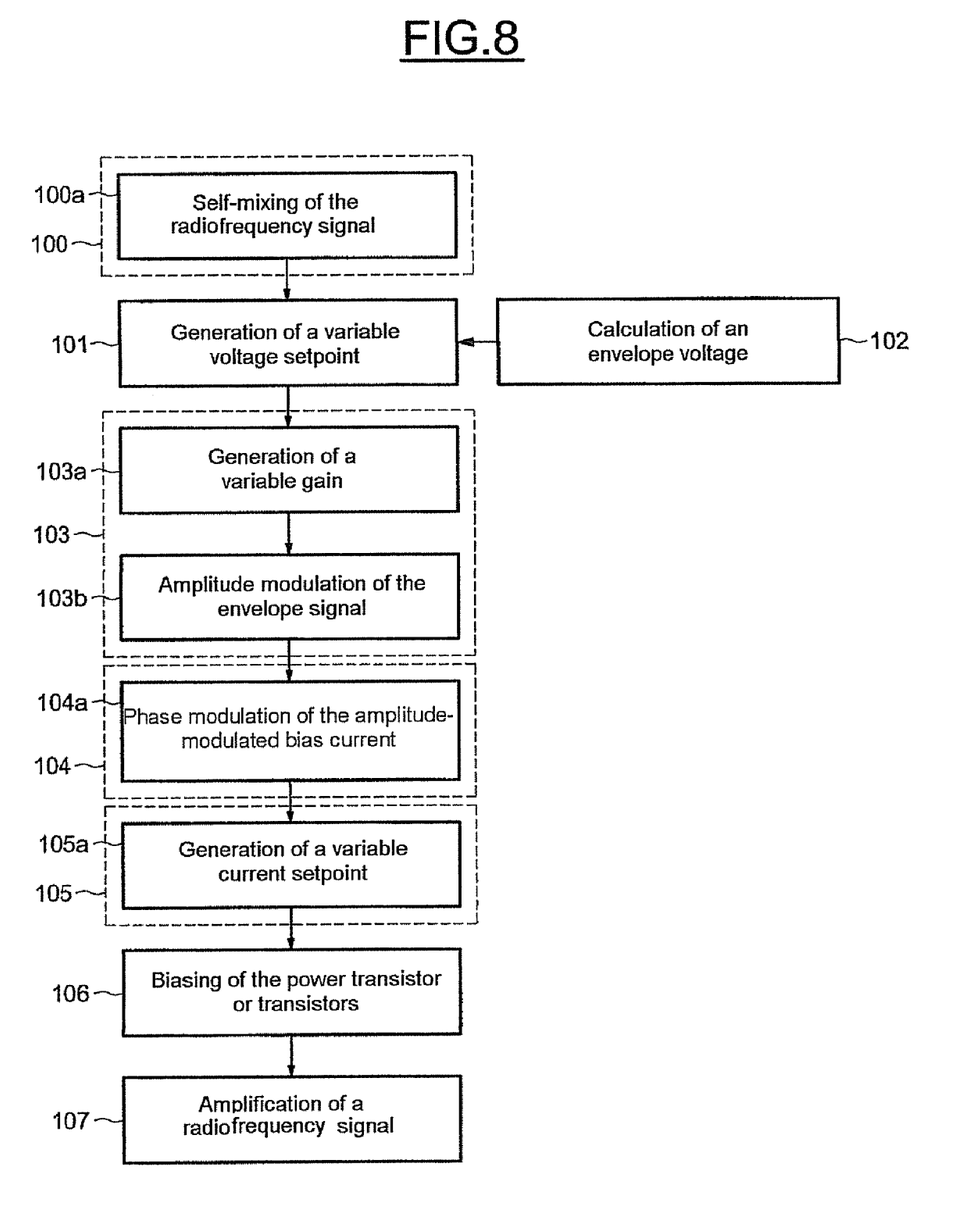
FIG. 8 is a diagram of the main steps of an implementation of a radiofrequency signal power amplification method, according to the present disclosure.

It may be noted that, for a given amplified signal power of between approximately 19 and 28 dBm, the amplitude modulation using the variable voltage setpoint Vcons makes it possible to greatly improve the linearity of the transistor compared to a conventional adaptive transistor. FIG. 8 shows a flow diagram of the steps of a method according to the present disclosure implemented by the device that has just been described.

This method may be implemented in a computer embedded in a wireless communication appliance, such as a cellular mobile telephone, in software form or also in the form of logic circuits. In a first step 100, an envelope signal representative of the envelope of a radiofrequency signal is determined. This determination step 100 comprises a self-mixing step 100a for the radiofrequency signal in order to determine the envelope signal. Then, in a second step 101, a variable voltage setpoint is generated. As a variant, a step 102 for calculating an envelope voltage intended for the generation of the variable voltage setpoint is carried out.

Then, a fourth step 103 is carried out, in which an amplitude-modulated bias current is generated from the envelope signal and from the variable voltage setpoint. This fourth step 103 comprises a step 103a for generating a variable gain and a modulation step 103b intended to amplitude modulate, using the generated variable gain, the determined envelope signal.

A fifth step 104 is then carried out in which an amplitude and phase modulated bias current is generated. This fifth step 104 comprises a phase modulation 104a of the amplitude-modulated bias current, for example, a filtering of the amplitude-modulated bias current based on two variable cut-off frequencies so as to advance or delay the modulated bias current relative to the envelope of the differential radiofrequency signal RFe+, RFe−.

Then, a sixth step 105 may be carried out in which the amplitude and phase-modulated bias current is added together with a variable current setpoint. This sixth step 105 comprises a step 105a in which the variable current setpoint is generated. Finally, a seventh step 106 is carried out in which one or more of the power transistors are biased on the basis of the amplitude and phase-modulated bias signal, for example, added together with the variable current setpoint, and an eighth step 107 is carried out in which the radiofrequency signal is amplified using the duly biased power transistor or transistors.

The invention claimed is:

1. A method of amplifying a radiofrequency signal with at least one power transistor, the method comprising:
    determining an envelope signal representative of an envelope of the radiofrequency signal;
    generating a variable voltage setpoint based upon an average power of the radiofrequency signal;
    generating an amplitude-modulated bias current based on the envelope signal and on the variable voltage setpoint; and
    biasing of the at least one power transistor based upon the amplitude-modulated bias current.

2. The method according to claim 1 wherein determining the envelope signal comprises a self-mixing of the radiofrequency signal; and wherein generating the amplitude-modulated bias current comprises an amplitude modulation of the envelope signal using the variable voltage setpoint.

3. The method according to claim 1 further comprising calculating an envelope voltage of the radiofrequency signal; and wherein the variable voltage setpoint is generated based upon an open loop mode voltage setpoint and the envelope voltage.

4. The method according to claim 1 wherein generating the amplitude-modulated bias current comprises generating a variable gain based on the variable voltage setpoint, the amplitude-modulated bias current being generated based upon the variable gain and the envelope signal.

5. The method according to claim 1 further comprising:
    generating an amplitude and phase modulated bias current based upon a phase modulation of the amplitude-modulated bias current; and
    biasing of the at least one power transistor based upon the amplitude and phase modulated bias current.

6. The method according to claim 5 wherein the phase modulation comprises at least one of a phase advance and a phase delay of the amplitude-modulated bias current relative to a phase of the envelope of the radiofrequency signal.

7. The method according to claim 1 further comprising adding the amplitude-modulated bias current and a variable current setpoint.

8. The method according to claim 7 further comprising generating the variable current setpoint based upon characteristics of the at least one power transistor.

9. A power amplification circuit for a radiofrequency signal comprising:
- a signal input configured to receive the radiofrequency signal;
- an amplification stage coupled to said signal input, and having at least one power transistor and a plurality of inputs coupled to said signal input;
- a biasing stage coupled upstream of said amplification stage and configured to deliver a bias voltage to the plurality of inputs of said amplification stage;
- a processing stage comprising
  - a processing input coupled to said signal input,
  - a processing output configured to deliver an amplitude-modulated bias current to said biasing stage, and
  - an amplitude modulator coupled between said processing input and said processing output and configured to
    - determine an envelope signal representative of an envelope of the radiofrequency signal,
    - modulate an amplitude of the envelope signal based upon a variable voltage setpoint, and
    - generate the amplitude-modulated bias current based on the modulated envelope signal.

10. The power amplification circuit according to claim 9 wherein said amplitude modulator comprises a self-mixing stage for the radiofrequency signal.

11. The power amplification circuit according to claim 9 wherein said amplitude modulator comprises a bias interface stage configured to generate a variable gain based upon the variable voltage setpoint, and to modulate the amplitude of the envelope signal based on the variable gain.

12. The power amplification circuit according to claim 9 wherein said processing stage is configured to generate the variable voltage setpoint based upon an average power of the radiofrequency signal.

13. The power amplification circuit according to claim 9 wherein said processing stage comprises:
- a subtracter; and
- a calculator coupled between an output of said amplification stage and said subtracter and configured to calculate an envelope voltage of the radiofrequency signal;
- said subtracter being configured to generate the variable voltage setpoint based upon a difference between an open loop mode voltage setpoint and the envelope voltage.

14. The power amplification circuit according to claim 9 wherein said processing stage comprises a phase modulator coupled between an output of said amplitude modulator and said processing output and configured to generate an amplitude and phase modulated bias current based on the amplitude-modulated bias current.

15. The power amplification circuit according to claim 14 wherein said phase modulator comprises a filter having cut-off frequencies, the cut-off frequencies being varied using a plurality of variable current gains, said filter being configured to phase-shift the amplitude-modulated bias current relative to a phase of the envelope of the radiofrequency signal.

16. The power amplification circuit according to claim 15 wherein said filter comprises at least one of an integrator type filter and a differentiator type filter.

17. The power amplification circuit according to claim 9 wherein said processing stage comprises a current summer coupled between an output of said phase modulator and said processing output and configured to add together the amplitude-modulated bias current and a variable current setpoint.

18. The power amplification circuit according to claim 17 wherein said processing stage comprises a generator configured to generate the variable current setpoint based upon characteristics of the at least one power transistor.

19. The power amplification circuit according to claim 9 wherein each power transistor comprises a control electrode for receiving a bias voltage.

20. The power amplification circuit according to claim 9 wherein said biasing stage comprises a power transistor, and a current mirror structure having a baseband amplification factor.

21. The power amplification circuit according to claim 20 wherein the current mirror structure comprises a control electrode for receiving the amplitude-modulated bias current.

22. A power amplification circuit for a radiofrequency signal comprising:
- an amplification stage having a plurality of inputs configured to receive the radiofrequency signal;
- a biasing stage coupled upstream said amplification stage and configured to deliver a bias voltage to the plurality of inputs of said amplification stage; and
- a processing stage configured to deliver an amplitude-modulated bias current to said biasing stage by at least
  - determining an envelope signal representative of an envelope of the radiofrequency signal,
  - modulating an amplitude of the envelope signal based upon a variable voltage setpoint, and
  - generating the amplitude-modulated bias current based on the modulated envelope signal.

23. The power amplification circuit according to claim 22 wherein said processing stage comprises a self-mixing stage for the radiofrequency signal.

24. The power amplification circuit according to claim 22 wherein said processing stage comprises a bias interface stage configured to generate a variable gain based upon the variable voltage setpoint, and to modulate the amplitude of the envelope signal based on the variable gain.

25. The power amplification circuit according to claim 22 wherein said processing stage is configured to generate the variable voltage setpoint based upon an average power of the radiofrequency signal.

26. The power amplification circuit according to claim 22 wherein said amplification stage comprises at least one power transistor; and wherein said processing stage comprises:
- a subtracter; and
- a calculator coupled between an output of said amplification stage and said subtracter and configured to calculate an envelope voltage of the radiofrequency signal amplified by the at least one power transistor;
- said subtracter being configured to generate the variable voltage setpoint based upon a difference between an open loop mode voltage setpoint and the envelope voltage.

27. A wireless communication appliance comprising:
- a power amplification circuit for a radiofrequency signal comprising
  - an amplification stage having a plurality of inputs configured to receive the radiofrequency signal,
  - a biasing stage coupled upstream said amplification stage and configured to deliver a bias voltage to the plurality of inputs of said amplification stage, and
  - a processing stage configured to deliver an amplitude-modulated bias current to said biasing stage by at least
    - determining an envelope signal representative of an envelope of the radiofrequency signal,
    - modulating an amplitude of the envelope signal based upon a variable voltage setpoint, and
    - generating the amplitude-modulated bias current based on the modulated envelope signal.

28. The wireless communication appliance according to claim 27 wherein said processing stage comprises a self-mixing stage for the radiofrequency signal.

29. The wireless communication appliance according to claim 27 wherein said processing stage comprises a bias interface stage configured to generate a variable gain based upon the variable voltage setpoint, and to modulate the amplitude of the envelope signal based on the variable gain.

30. The wireless communication appliance according to claim 27 wherein said processing stage is configured to generate the variable voltage setpoint based upon an average power of the radiofrequency signal.

31. The wireless communication appliance according to claim 27 wherein said amplification stage comprises at least one power transistor; and wherein said processing stage comprises:
    a subtracter; and
    a calculator coupled between an output of said amplification stage and said subtracter and configured to calculate an envelope voltage of the radiofrequency signal amplified by the at least one power transistor;
    said subtracter being configured to generate the variable voltage setpoint based upon a difference between an open loop mode voltage setpoint and the envelope voltage.

32. A method of amplifying a radiofrequency signal with at least one power transistor, the method comprising:
    determining an envelope signal representative of an envelope of the radiofrequency signal by at least calculating an envelope voltage of the radiofrequency signal;
    generating an amplitude-modulated bias current based on the envelope signal and on a variable voltage setpoint, the variable voltage setpoint being based upon an open loop mode voltage setpoint and the envelope voltage; and
    biasing of the at least one power transistor based upon the amplitude-modulated bias current.

33. The method according to claim 32 wherein determining the envelope signal comprises a self-mixing of the radiofrequency signal; and wherein generating the amplitude-modulated bias current comprises an amplitude modulation of the envelope signal using the variable voltage setpoint.

34. The method according to claim 32 further comprising:
    generating an amplitude and phase modulated bias current based upon a phase modulation of the amplitude-modulated bias current; and
    biasing of the at least one power transistor based upon the amplitude and phase modulated bias current.

35. A method of amplifying a radiofrequency signal with at least one power transistor, the method comprising:
    determining an envelope signal representative of an envelope of the radiofrequency signal;
    generating an amplitude-modulated bias current based on the envelope signal and on a variable voltage setpoint, the generating comprising generating a variable gain based on the variable voltage setpoint, the amplitude-modulated bias current being generated based upon the variable gain and the envelope signal; and
    biasing of the at least one power transistor based upon the amplitude-modulated bias current.

36. The method according to claim 35 wherein determining the envelope signal comprises a self-mixing of the radiofrequency signal; and wherein generating the amplitude-modulated bias current comprises an amplitude modulation of the envelope signal using the variable voltage setpoint.

37. The method according to claim 35 further comprising:
    generating an amplitude and phase modulated bias current based upon a phase modulation of the amplitude-modulated bias current; and
    biasing of the at least one power transistor based upon the amplitude and phase modulated bias current.

38. A power amplification circuit for a radiofrequency signal comprising:
    an amplification stage configured to receive the radiofrequency signal;
    a biasing stage configured to deliver a bias voltage to said amplification stage; and
    a processing stage configured to deliver an amplitude-modulated bias current to said biasing stage by at least
        determining an envelope signal representative of an envelope of the radiofrequency signal,
        modulating an amplitude of the envelope signal based upon a variable voltage setpoint, and
        generating the amplitude-modulated bias current based on the modulated envelope signal;
    said processing stage comprising a bias interface stage configured to generate a variable gain based upon the variable voltage setpoint and to modulate the amplitude of the envelope signal based on the variable gain.

39. The power amplification circuit according to claim 38 wherein said processing stage comprises a self-mixing stage for the radiofrequency signal.

40. The wireless communication appliance according to claim 38 wherein said processing stage is configured to generate the variable voltage setpoint based upon an average power of the radiofrequency signal.

41. A power amplification circuit for a radiofrequency signal comprising:
    an amplification stage configured to receive the radiofrequency signal;
    a biasing stage configured to deliver a bias voltage to said amplification stage; and
    a processing stage configured to deliver an amplitude-modulated bias current to said biasing stage by at least
        determining an envelope signal representative of an envelope of the radiofrequency signal,
        modulating an amplitude of the envelope signal based upon a variable voltage setpoint, and
        generating the amplitude-modulated bias current based on the modulated envelope signal;
    said processing stage configured to generate the variable voltage setpoint based upon an average power of the radiofrequency signal.

42. The power amplification circuit according to claim 41 wherein said processing stage comprises a self-mixing stage for the radiofrequency signal.

43. The power amplification circuit according to claim 41 wherein said processing stage comprises a bias interface stage configured to generate a variable gain based upon the variable voltage setpoint, and to modulate the amplitude of the envelope signal based on the variable gain.

44. A power amplification circuit for a radiofrequency signal comprising:
    an amplification stage configured to receive the radiofrequency signal and comprising at least one power transistor;
    a biasing stage configured to deliver a bias voltage to said amplification stage; and a processing stage configured to deliver an amplitude-modulated bias current to said biasing stage by at least
determining an envelope signal representative of an envelope of the radiofrequency signal,
modulating an amplitude of the envelope signal based upon a variable voltage setpoint, and
generating the amplitude-modulated bias current based on the modulated envelope signal;
said processing stage comprising
a subtracter, and
a calculator coupled between an output of said amplification stage and said subtracter and configured to calculate an envelope voltage of the radiofrequency signal amplified by the at least one power transistor, said subtracter being configured to generate the variable voltage setpoint based upon a difference between an open loop mode voltage setpoint and the envelope voltage.

45. The power amplification circuit according to claim 44 wherein said processing stage comprises a self-mixing stage for the radiofrequency signal.

46. The power amplification circuit according to claim 44 wherein said processing stage comprises a bias interface stage configured to generate a variable gain based upon the variable voltage setpoint, and to modulate the amplitude of the envelope signal based on the variable gain.

* * * * *